United States Patent
Kim et al.

(10) Patent No.: US 10,606,966 B2
(45) Date of Patent: Mar. 31, 2020

(54) METHOD AND APPARATUS FOR MODELING DEFORMABLE BODY INCLUDING PARTICLES

(71) Applicant: SAMSUNG ELECTRONICS CO., LTD., Suwon-si (KR)

(72) Inventors: Jiyeon Kim, Hwaseong-si (KR); Nahyup Kang, Seoul (KR); Hyong Euk Lee, Suwon-si (KR); Hwiryong Jung, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 779 days.

(21) Appl. No.: 14/813,459

(22) Filed: Jul. 30, 2015

(65) Prior Publication Data

US 2016/0063152 A1 Mar. 3, 2016

(30) Foreign Application Priority Data

Aug. 26, 2014 (KR) .................. 10-2014-0111468

(51) Int. Cl.
*G06F 17/10* (2006.01)
*G06F 17/50* (2006.01)

(52) U.S. Cl.
CPC .................. *G06F 17/5009* (2013.01)

(58) Field of Classification Search
None
See application file for complete search history.

(56) References Cited

U.S. PATENT DOCUMENTS

| 4,821,214 A * | 4/1989 | Sederberg ............... G06T 19/20 345/420 |
| 5,633,951 A * | 5/1997 | Moshfeghi ........... G06K 9/6207 375/E7.084 |
| 6,421,048 B1 * | 7/2002 | Shih ....................... G06F 3/016 345/419 |
| 7,773,088 B2 | 8/2010 | Keller et al. |
| 2001/0040997 A1 * | 11/2001 | Tsap ..................... G06T 7/0012 382/154 |
| 2002/0089500 A1 * | 7/2002 | Jennings, Jr. ........... G06T 19/20 345/420 |

(Continued)

FOREIGN PATENT DOCUMENTS

JP 3566009 B2 9/2004
JP 2012-164320 8/2012

(Continued)

OTHER PUBLICATIONS

Henri Gavin Four Strain Energy Concepts in Pictures Dept. of Civil and Environmental Engineering, Fall 2012.*

(Continued)

*Primary Examiner* — Rehana Perveen
*Assistant Examiner* — Cuong V Luu
(74) *Attorney, Agent, or Firm* — NSIP Law

(57) ABSTRACT

Provided are a method and a corresponding apparatus for modeling a deformable body including particles that define a strain energy generated by an external force with respect to a deformable body including particles, and control a displacement of the deformable body based on a volume of the particles corresponding to the displacement of the deformable body, where the displacement is determined based on the strain energy.

18 Claims, 7 Drawing Sheets

(56) References Cited

U.S. PATENT DOCUMENTS

| | | | |
|---|---|---|---|
| 2004/0227761 A1* | 11/2004 | Anderson | G06T 13/40 345/473 |
| 2005/0086034 A1* | 4/2005 | Naito | G06F 17/5018 703/2 |
| 2005/0235756 A1* | 10/2005 | Koenemann | G06F 17/5018 73/760 |
| 2005/0267695 A1* | 12/2005 | German | G01N 3/30 702/41 |
| 2006/0106586 A1* | 5/2006 | Naito | G06F 17/5018 703/2 |
| 2006/0158449 A1* | 7/2006 | Brombolich | G06F 17/5018 345/420 |
| 2007/0239409 A1* | 10/2007 | Alan | G06F 17/5009 703/2 |
| 2007/0239411 A1* | 10/2007 | Yamashita | G06F 17/5018 703/7 |
| 2008/0071507 A1* | 3/2008 | Hodgins | G01S 5/16 703/6 |
| 2008/0192049 A1* | 8/2008 | Schiwietz | G06T 3/0093 345/420 |
| 2009/0024376 A1* | 1/2009 | Hori | G06F 17/5009 703/12 |
| 2010/0277475 A1 | 11/2010 | McAdams et al. | |
| 2011/0243401 A1* | 10/2011 | Zabair | G06K 9/00 382/128 |
| 2012/0038639 A1* | 2/2012 | Mora | G06T 15/04 345/420 |
| 2012/0185218 A1* | 7/2012 | Bickel | G06T 19/20 703/1 |
| 2013/0054208 A1* | 2/2013 | Naito | G01N 33/445 703/2 |
| 2013/0187930 A1* | 7/2013 | Millman | G06T 13/20 345/473 |
| 2013/0197881 A1* | 8/2013 | Mansi | A61N 1/3627 703/2 |
| 2013/0338977 A1 | 12/2013 | Kazama et al. | |
| 2014/0071125 A1* | 3/2014 | Burlina | G06T 17/00 345/420 |
| 2014/0104274 A1 | 4/2014 | Hilliges et al. | |
| 2014/0214378 A1* | 7/2014 | Kazama | G06F 17/5009 703/2 |
| 2014/0267252 A1* | 9/2014 | Hutchinson | G06T 13/20 345/420 |
| 2014/0278298 A1* | 9/2014 | Maerten | G01V 99/005 703/2 |
| 2014/0288906 A1* | 9/2014 | Sakaguchi | G06F 17/5009 703/2 |
| 2015/0029198 A1* | 1/2015 | Sumner | G06T 13/20 345/474 |
| 2015/0120258 A1* | 4/2015 | Kang | G06F 17/5009 703/2 |
| 2015/0356218 A1* | 12/2015 | Spears | G06F 17/5018 702/42 |
| 2016/0117428 A1* | 4/2016 | Jung | G06F 17/5009 703/2 |
| 2016/0140255 A1* | 5/2016 | Kim | G06F 17/5018 703/1 |
| 2016/0140266 A1* | 5/2016 | Kang | G06F 17/5009 703/1 |
| 2016/0140750 A1* | 5/2016 | Pai | G06T 13/20 345/420 |

FOREIGN PATENT DOCUMENTS

| | | |
|---|---|---|
| JP | 2013-097813 A | 5/2013 |
| JP | 5197640 B2 | 5/2013 |
| JP | 5441422 B2 | 3/2014 |
| KR | 10-2006-0090494 A | 8/2006 |
| KR | 10-1244826 B1 | 3/2013 |
| KR | 10-2014-0043344 A | 4/2014 |
| KR | 10-1394585 B1 | 5/2014 |

OTHER PUBLICATIONS

Wikibooks A-Level Physics https//en.wikibooks.org/wiki/A-level_Physics_(Advancing_Physics)/Stress, Strain & Young's Modulus, Sep. 19, 2018.*

Engineering Tool Box Stress, Strain and Young's Modulus https://www.engineeringtoolbox.com/stress-strain-d_950.html, Aug. 18, 2018.*

Zhong et al. Deformable Object Simulation with Poisson Equation Proceeding of the IEEE, Jul. 2005 (Year: 2005).*

Tokoi et al. Particle Based Skinning Sixth International Conference on Computer Graphics, Imaging and Visualization, 2009 (Year: 2009).*

Stress, Strain and Young's Modulus The Engineering Tool Box https://www.engineeringtoolbox.com/stress-strain-d_950.html, printed 2018.*

Muller et al. Point Based Animation of Elastic, Plastic and Melting Objects ACM Siggraph Symposium on Computer Animation, 2004 (Year: 2004).*

Aras et al. Meshless Elasticity Model and contact Mechanics-based Verification Technique Biomechanics for Medicine, 2014 (Year: 2014).*

* cited by examiner

METHOD AND APPARATUS FOR MODELING DEFORMABLE BODY INCLUDING PARTICLES

CROSS-REFERENCE TO RELATED APPLICATION(S)

This application claims the benefit under 35 U.S.C. § 119(a) of Korean Patent Application No. 10-2014-0111468 filed on Aug. 26, 2014, in the Korean Intellectual Property Office, the entire disclosure of which is incorporated herein by reference for all purposes.

BACKGROUND

1. Field

The following description relates to a method and apparatus for modeling a deformable body that includes particles.

2. Description of Related Art

In a computer graphics (CG) area, such as in particular, in a visual effects (VFX) field, various objects are modeled. In such a context, objects to be modeled may be classified into a rigid body, a deformable body, and a fluid.

Modeling a deformable body may require a guarantee of accuracy of calculating a level of deformation or motion of the deformable body. Thus, the deformable body may be modeled in view of a physical characteristic of the deformable body, an appropriate boundary condition, and an exact external force applied.

In general, a finite element method (FEM) for dividing a deformable body into meshes and numerically solving movements of the meshes with respect to time may be used to model a deformable body. However, the FEM requires a considerable amount of calculation cost. Thus, the FEM approach may be difficult to use for real-time simulation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The foregoing and/or other aspects are achieved by providing a method of modeling a deformable body including particles.

In one general aspect, a method of modeling a deformable body comprising particles includes defining a strain energy generated by an external force with respect to a deformable body comprising particles, determining a displacement of the deformable body based on the strain energy, and controlling the displacement of the deformable body based on a volume of the particles corresponding to the displacement.

The defining may include defining the strain energy using a strain energy density function based on the external force and the displacement.

The strain energy density function may include a parameter associated with an elasticity of the deformable body.

The determining may include defining a variation in an internal force generated in an internal portion of the deformable body based on the strain energy, and determining the displacement of the deformable body based on the variation in the internal force.

The controlling may include verifying whether the volume of the particles is preserved by the displacement, and controlling the displacement based on a result of the verifying.

The verifying may include verifying whether an overall volume of the particles relocated by the displacement is preserved.

The verifying of whether the overall volume of the particles is preserved may include verifying whether the overall volume of the particles is preserved, based on a comparison between the overall volume of the particles before and after the particles are relocated by the displacement.

The verifying of whether the overall volume of the particles is preserved may include verifying whether the overall volume of the particles relocated by the displacement is within a predetermined range.

The method may further include receiving a modeling condition comprising constraints and the external force for modeling of the deformable body.

The external force may change, at each time step, over time.

In another general aspect, a non-transitory computer-readable medium stores a program for causing a processor to perform the above method.

In another general aspect, an apparatus to model a deformable body comprising particles includes an analyzer configured to define a strain energy generated by an external force with respect to a deformable body comprising particles, and a controller configured to control a volume of the particles corresponding to the displacement based on a volume of the particles corresponding to a displacement of the deformable body determined based on the strain energy.

The defining may include defining the strain energy using a strain energy density function based on the external force and the displacement.

The defining may include defining a variation in an internal force generated in an internal portion of the deformable body based on the strain energy, and determining the displacement of the deformable body based on the variation in the internal force.

The controlling may include verifying whether the volume of the particles is preserved by the displacement, and controlling the displacement based on a result of the verifying.

The verifying may include verifying whether an overall volume of the particles relocated by the displacement is preserved.

The verifying of whether the overall volume of the particles is preserved may include verifying whether the overall volume of the particles is preserved, based on a comparison between the overall volume of the particles before and after the particles are relocated by the displacement.

The verifying of whether the overall volume of the particles is preserved may include verifying whether the overall volume of the particles relocated by the displacement is within a predetermined range.

The analyzer may be configured to receive a modeling condition comprising constraints and the external force for modeling of the deformable body.

The external force may change, at each time step, over time.

In another general aspect, a method of modeling a deformable body comprising particles includes defining a strain energy generated by an external force with respect to a deformable body comprising particles, and controlling a volume of the particles corresponding to the displacement of the deformable body based on a volume of the particles corresponding to a displacement of the deformable body determined based on the strain energy.

Other features and aspects will be apparent from the following detailed description, the drawings, and the claims.

Figure 1:
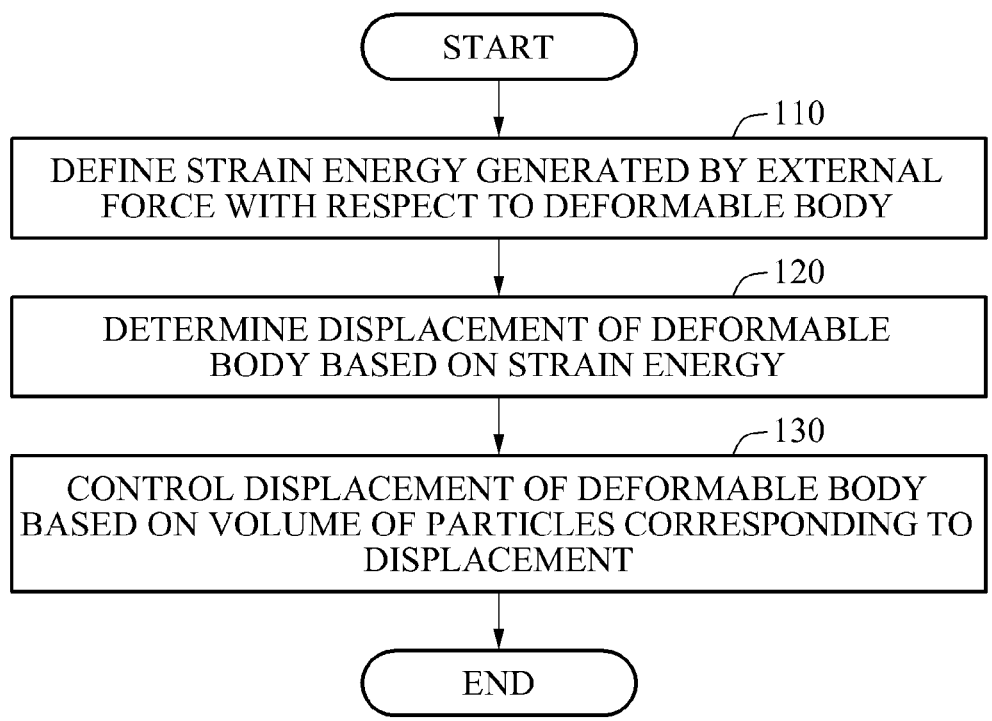
FIG. 1 illustrates a method of modeling a deformable body including particles according to an example.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Reference is now made further to examples, examples of which are illustrated in the accompanying drawings, wherein like reference numerals refer to like elements throughout. Such examples are presented below to explain the present disclosure with reference to the figures.

Though the present disclosure provides for several possible examples, specific examples are shown in drawings and are explained in detail. However, the present disclosure is not intended to be limiting, and it is intended that various modifications, equivalents, and alternatives are also covered within the scope of the examples.

Terms used herein are intended to merely explain specific examples, thus terms are not meant to be limiting. For example, a singular expression is intended to include a plural expression except in specific situations where two such expressions are contextually different from each other. As used in this description, a term "include" or "have" is intended to indicate that characteristics, figures, steps, operations, components, elements disclosed on the specification or combinations thereof exist. However, the term "include" or "have" is intended to be understood so as not to pre-exclude existence of one or more other characteristics, figures, steps, operations, components, elements or combinations thereof or additional possibilities for other features of an example.

Excepting terms that are specifically defined differently, all terms used herein including technical or scientific terms have the same meanings with terms that are generally understood by those skilled in the art related to the field of the present disclosure. The terms that are the same as those of which are defined in a general dictionary are to be understood such that the terms have meanings same as contextual meanings of the related art. And, as long as the terms are not specifically defined in the present disclosure, the terms are not to be interpreted as having ideal or excessively formal meanings.

Thus, certain embodiments are explained in more detail with reference to the attached drawings. The same component or components corresponding to each other are provided with the same reference numeral, and their detailed explanation is omitted. For example, when it is determined that a detailed description is related to a related known function or configuration that potentially makes the purpose and/or advantages of the present disclosure unnecessarily ambiguous in the description, such a detailed description is omitted.

FIG. 1 illustrates a method of modeling a deformable body including particles according to an example.

Referring to FIG. 1, in operation 110, the method defines a strain energy generated by an external force with respect to a deformable body. For example, an apparatus for modeling a deformable body including particles, hereinafter, a "modeling apparatus", according to examples defines a strain energy generated by an external force with respect to a deformable body including particles. In such an example, the strain energy refers to a change in a volume or shape of an object that occurs when an external force is applied to the object.

In this example, the modeling apparatus receives a modeling condition including constraints and the external force for modeling the deformable body before defining the strain energy. For example, the external force changes at each time step. The modeling condition is also alternatively referred to as a boundary condition.

For example, the modeling apparatus defines the strain energy using a strain energy density function in which the external force and a displacement are variables.

In examples, the strain energy density function is obtained by functionalizing an energy used for deformation, among work performed by an external force. Here, the strain energy density function treats a volume of the deformable body as unchanged. In some examples, the strain energy density function also includes a parameter associated with an intrinsic elasticity of the deformable body.

In operation 120, the method determines a displacement of the deformable body based on the defined strain energy. For example, the modeling apparatus determines a displacement of the deformable body based on the defined strain energy. In an example, the modeling apparatus defines a variation in an internal force generated in an internal portion of the deformable body based on the strain energy, and determines the displacement of the deformable body based on the variation in the internal force.

In this example, the displacement corresponds to a variation in a position as a vector value having a magnitude and a direction, and potentially changes as an external force changes at each time step. In this example, the modeling apparatus calculates the displacement at each time step, and calculates the variation in the internal force based on the calculated displacement.

In operation 130, the method controls the displacement of the deformable body based on a volume of the particles corresponding to the displacement. For example, the modeling apparatus controls the displacement of the deformable body based on a volume of the particles corresponding to the displacement. In an example, the modeling apparatus verifies whether the volume of the particles is preserved by the displacement, and controls the displacement based on a result of the verifying. Here, "controlling the displacement" is intended to refer to adjusting or changing the displacement to be increased or decreased.

For example, the modeling apparatus calculates a level of a change in volume, that is, a volume sensitivity, by calculating a volume of each particle, and adjusting the displacement or the variation in the internal force to maintain the calculated volume or to prevent the calculated volume from exceeding a threshold.

In examples, the modeling apparatus considers the deformable body as a set of small particles, and uses a particle-based modeling scheme of numerically calculating interactions and movements between the constituent particles, thereby easily performing parallel processing based on modeling of individual particles in a calculation process, and enabling real-time modeling of groups of particles that constitute the deformable body. In addition, many deformable bodies to be modeled are composed of incompressible materials. Thus, a volume preservation scheme of a deformable body is applied when such particle-based modeling is performed, in order to represent the feature that certain deformable bodies are not compressible, and hence their total volume is to be modeled by preserving the same volume.

In examples, the modeling apparatus proceeds with modeling while updating the displacement or a force at each time step.

Figure 2:
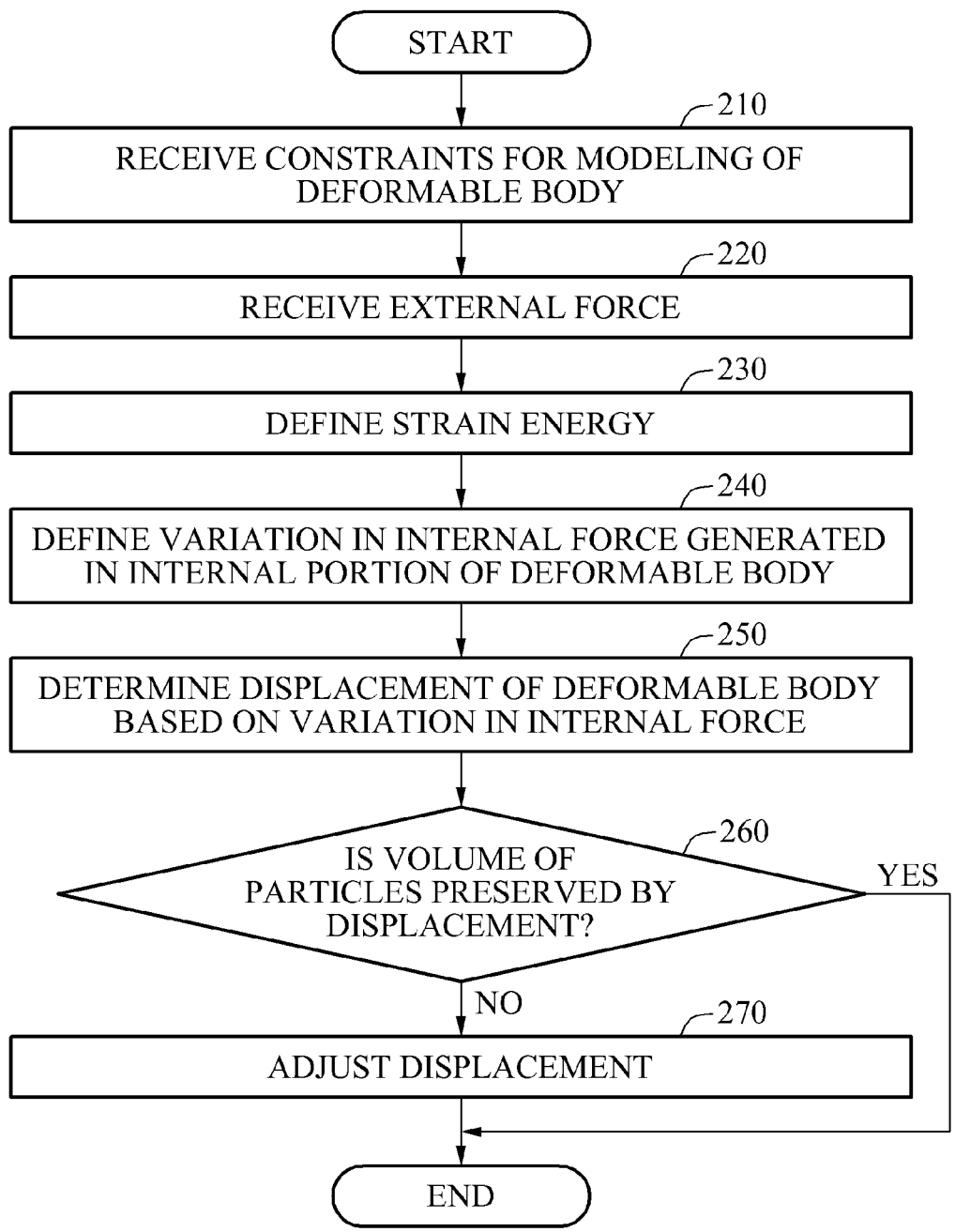
FIG. 2 illustrates a method of modeling a deformable body including particles according to an example.

FIG. 2 illustrates a method of modeling a deformable body including particles according to an example.

Referring to FIG. 2, in operation 210, the method receives constraints for modeling of a deformable body. For example, a modeling apparatus according to examples receives constraints for modeling of a deformable body from an external device, and the like. In examples, the constraints include various conditions to be considered for precise modeling of a corresponding deformable body. For example, such a condition is a condition that the deformable body is to be fixed on a touching plane, for example, a floor surface 315 of FIG. 3, when modeling the deformable body.

Figure 3:
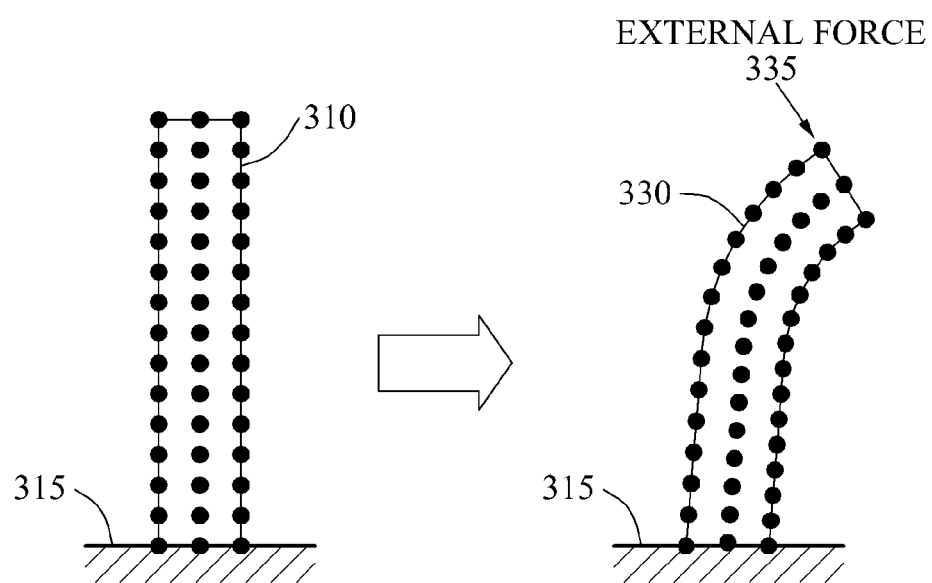
FIG. 3 illustrates a case in which constraints and an external force are applied to a deformable body in a method of modeling a deformable body including particles according to an example.

In operation 220, the method receives an external force. For example, the modeling apparatus receives an external force. In this context, a condition including the constraints and the external force is referred to as a modeling condition. An example of a case in which the constraints and the external force are applied to an object to be modeled is represented as shown in FIG. 3. Additional descriptions are provided later with reference to FIG. 3.

In operation 230, the method defines a strain energy generated by the external force with respect to the deformable body including particles. For example, the modeling apparatus defines a strain energy generated by the external force with respect to the deformable body including particles.

In operation 240, the method defines a variation in an internal force generated in an internal portion of the deformable body based on the strain energy the modeling apparatus. For example, the modeling apparatus defines a variation in an internal force generated in an internal portion of the deformable body based on the strain energy. In this example, the internal force refers to a force that is used to deform the internal portion of the deformable body, where the deformed internal portion of the deformable body is restorable when the external force is eliminated.

For example, the modeling apparatus calculates a displacement of each particle at each time step, updates the internal force by calculating a variation in the internal force based on the calculated displacement, and proceeds with a subsequent time step.

Figure 4:
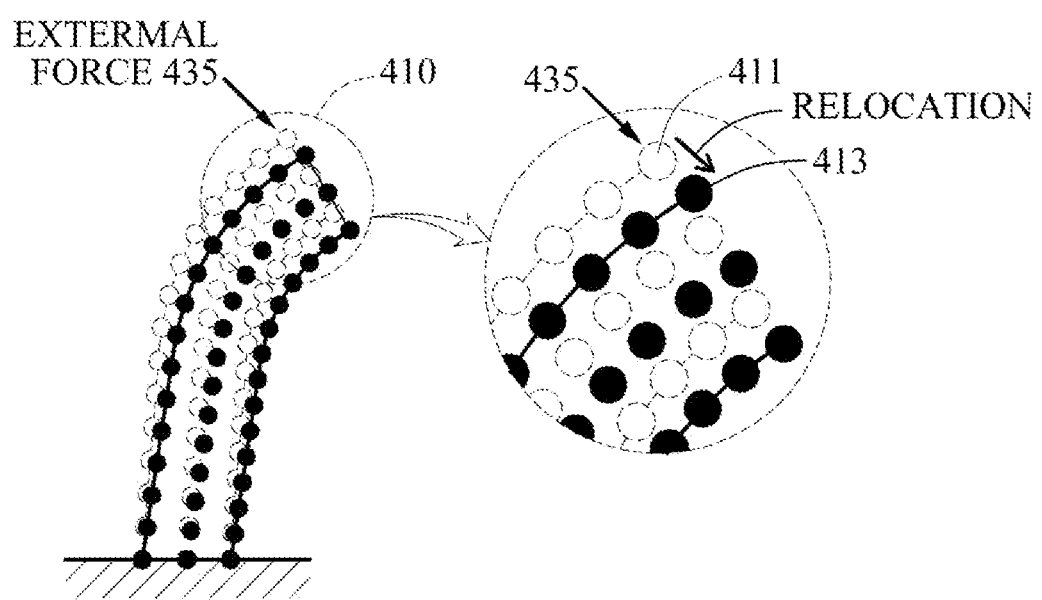
FIG. 4 illustrates a displacement by an external force in a method of modeling a deformable body including particles according to an example.

In operation 250, the method determines a displacement of the deformable body based on the variation in the internal force modeling apparatus. For example, the modeling apparatus determines a displacement of the deformable body based on the variation in the internal force. In such an example, the displacement of the deformable body determined based on the variation in the internal force is represented as shown in FIG. 4.

In operation 260, the method verifies whether a volume of the particles is preserved by the determined displacement. For example, the modeling apparatus verifies whether a volume of the particles is preserved by the determined displacement. In such an example, the modeling apparatus verifies whether an overall volume of the particles rearranged by the determined displacement is preserved. For example, the modeling apparatus verifies whether the overall volume of the particles is preserved based on a variation in the overall volume of the particles before and after the position of the particles is changed by the displacement.

In this example, the overall volume of the particles is obtained by calculating and summing up volumes of respective particles.

When it is verified in operation 260 that the volume of the particles is preserved, the method maintains the determined displacement, without adjusting the displacement. For example, the modeling apparatus maintains the determined displacement, without adjusting the displacement.

Figure 5:
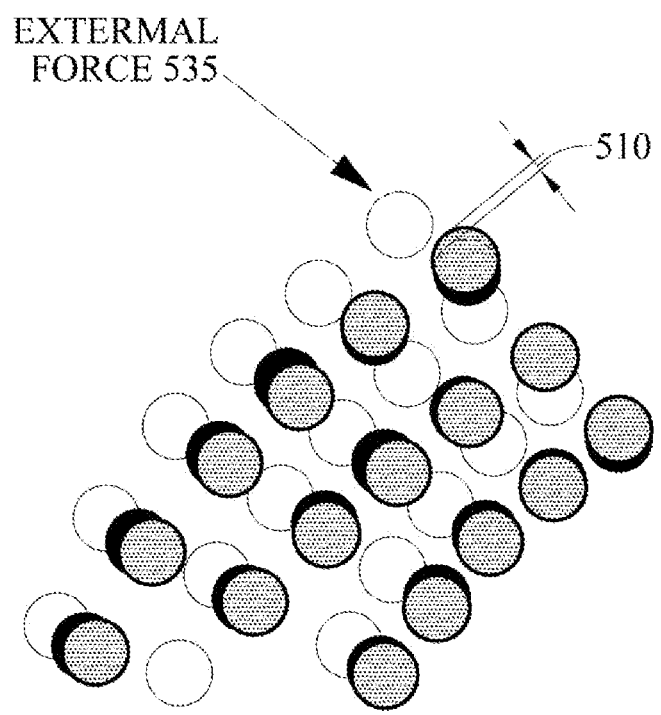
FIG. 5 illustrates an operation of adjusting a displacement in a method of modeling a deformable body including particles according to an example.

Conversely, when it is verified in operation 260 that the volume of the particles is not preserved, the method adjusts the displacement. For example, when it is verified in operation 260 that the volume of the particles is not preserved, the modeling apparatus may adjust the displacement, in operation 270. The displacement adjusted by the modeling apparatus is represented as shown in FIG. 5.

In examples, the modeling apparatus verifies whether the overall volume of the particles rearranged by the displacement is within a predetermined limited range, and adjusts the displacement when the overall volume exceeds the limited range.

For example, when an initial volume is V0, the modeling apparatus verifies whether a current volume V is within a predetermined limited range $V0-\varepsilon \leq V \leq V0+\varepsilon$. Here, $\varepsilon$ may be a number less than V0. $\varepsilon$ denotes a tolerance, in that the current volume V is allowed to vary from V0, but the absolute value of the difference between V0 and V is required to have an upper bound of $\varepsilon$.

Operations 210 through 270 describe a method for a situation in which the time step corresponds to a single time unit or time step.

As described above, the external force potentially changes at each time step. The time step refers to a time unit to be used to model the deformable body, for example, an iteration count. Thus, the time increases by a time unit for each iteration, and as each iteration occurs, the external force changes over time.

For example, when a single time unit to be used to perform modeling corresponds to a single second, that is, one second, and a time step corresponds to 100 such time units, the modeling apparatus models changes occurring each 100 seconds with respect to all the particles constituting the deformable body. The time step is selected to have an appropriate value by a program or a user of the modeling apparatus.

As time passes and the time increases by time step increments, the modeling apparatus again performs operations 210 through 270, and returns to operation 220 to model an effect by the external force at a new time step. In this example, the modeling apparatus iteratively performs operations 220 through 270 until the time step is satisfied, and the external force potentially changes at each time step.

Through the process described above, the modeling apparatus performs modeling of a deformable body while maintaining a volume as time proceeds by time steps. However, in such an approach, a considerably large external force and constraints are able to be applied and modeled successfully when compared to a geometrical model.

FIG. 3 illustrates a case in which constraints and an external force are applied to a deformable body in a method of modeling a deformable body including particles according to an example.

FIG. 3 illustrates a change in an elastic beam 310 in a situation in which the elastic beam 310 is fixed on the floor surface 315 and an external force 335 is applied to the elastic beam 310.

In the example of FIG. 3, the elastic beam 310 is modeled as particles, and is continuously fixed on the floor surface 315 before and after the external force 335 is applied. In this example, the elastic beam 310 fixed on the floor surface 315 is a constraint that is to be considered in modeling the elastic beam 310.

When the external force 335 is applied to an upper end of the elastic beam 310, the elastic beam 310 is potentially bent by the external force 335 in a direction in which the external force 335 is applied, as shown in an area 330.

In general, many materials constituting a deformable body have incompressible characteristics. While some materials have compressible characteristics, when a deformable body includes incompressible characteristics, modeling the deformable body successfully requires awareness of compression characteristics. When the deformable body is modeled as particles, the particles constituting the deformable body are sometimes relocated and a volume of the particles therefore shrinks or expands.

In examples, to calculate an internal force within a material generated by an external force, a work by the external force is accumulated in a form of a strain energy acting in an internal portion of a deformable body using a strain energy density function derived in terms of work and energy preservation.

FIG. 4 illustrates a displacement by an external force in a method of modeling a deformable body including particles according to an example.

FIG. 4 illustrates a displacement determined based on a variation in an internal force generated by an external force in an internal portion of a deformable body.

As described above, when an external force is applied to a deformable body, for example, the elastic beam 310 of FIG. 3, work performed by the external force is accumulated in a form of a strain energy in an internal portion of the deformable body, and acts as an internal force. Thus, the internal force of the deformable body changes, and a displacement 410 occurs in the deformable body based on a variation in the internal force.

In the example of FIG. 4, a position of a particle modeled in response to an initially applied external force 435 is a position 411. In this example, the particle is relocated from the position 411 to a position 413 based on a variation in an internal force generated by the external force. A variation in the position before and after the particle is relocated is considered to be the displacement 410 determined based on the variation in the internal force.

In the example of FIG. 4, a modeling apparatus determines the displacement 410 of the deformable body based on the variations in the internal force, and performs modeling. The modeling apparatus updates a force at each particle per time step based on the variations in the internal force. The updated force is expressed by a sum of variations in the internal force and the external force when the external force changes, for example, when the external force with respect to time changes.

The modeling apparatus calculates an acceleration at each particle by applying a variation in a force to Newton's Second Law, which provides that F=ma, where F is a force, m is a mass, and a is an acceleration, and sequentially determine, for example, a calculated value for a velocity and a displacement at each particle based on the calculated acceleration.

FIG. 5 illustrates an example of operation of adjusting a displacement in a method of modeling a deformable body including particles when an external force 535 is applied.

In the example of FIG. 5, a modeling apparatus verifies whether a volume of particles modeled by a displacement of a deformable body determined based on a variation in an internal force is preserved, as shown in FIG. 4. The modeling apparatus verifies whether the volume of the modeled particles is preserved based on whether an overall volume of the particles at relocated positions, similar to the relocated position 413 of FIG. 4, is equal to an overall volume of the particles at their previous positions, similar to the position 411 before the particles are relocated. A method of verifying whether an overall volume of particles is preserved is further described with reference to FIG. 6.

When it is verified that the volume of the particles is not preserved, the modeling apparatus preserves the volume of the modeled particles by adjusting the displacement, as shown in an area 510 in FIG. 5.

The modeling apparatus verifies whether a total volume of particles rearranged by the displacement determined based on the variation in the internal force is preserved at each time step, or whether the total volume of the rearranged particles satisfies a limitation on volume.

Whether the total volume of the rearranged particles satisfies the limitation on volume is verified based on whether the overall volume of the particles rearranged by the displacement is within a predetermined limited range.

In this example, when it is verified that the total volume of the rearranged particles is not preserved or does not satisfy the limitation on volume, the modeling apparatus performs displacement modification by multiplying the displacement by a constant so that a sum of all variations in volume satisfies a threshold based on a variation in a volume of each particle, for example, a difference between a previous time step and a current time step.

When it is verified that the volume of the particles is preserved, the modeling apparatus maintains the position of the rearranged particles, similar to the position 413 of FIG. 4, without adjusting the displacement.

Figure 6:
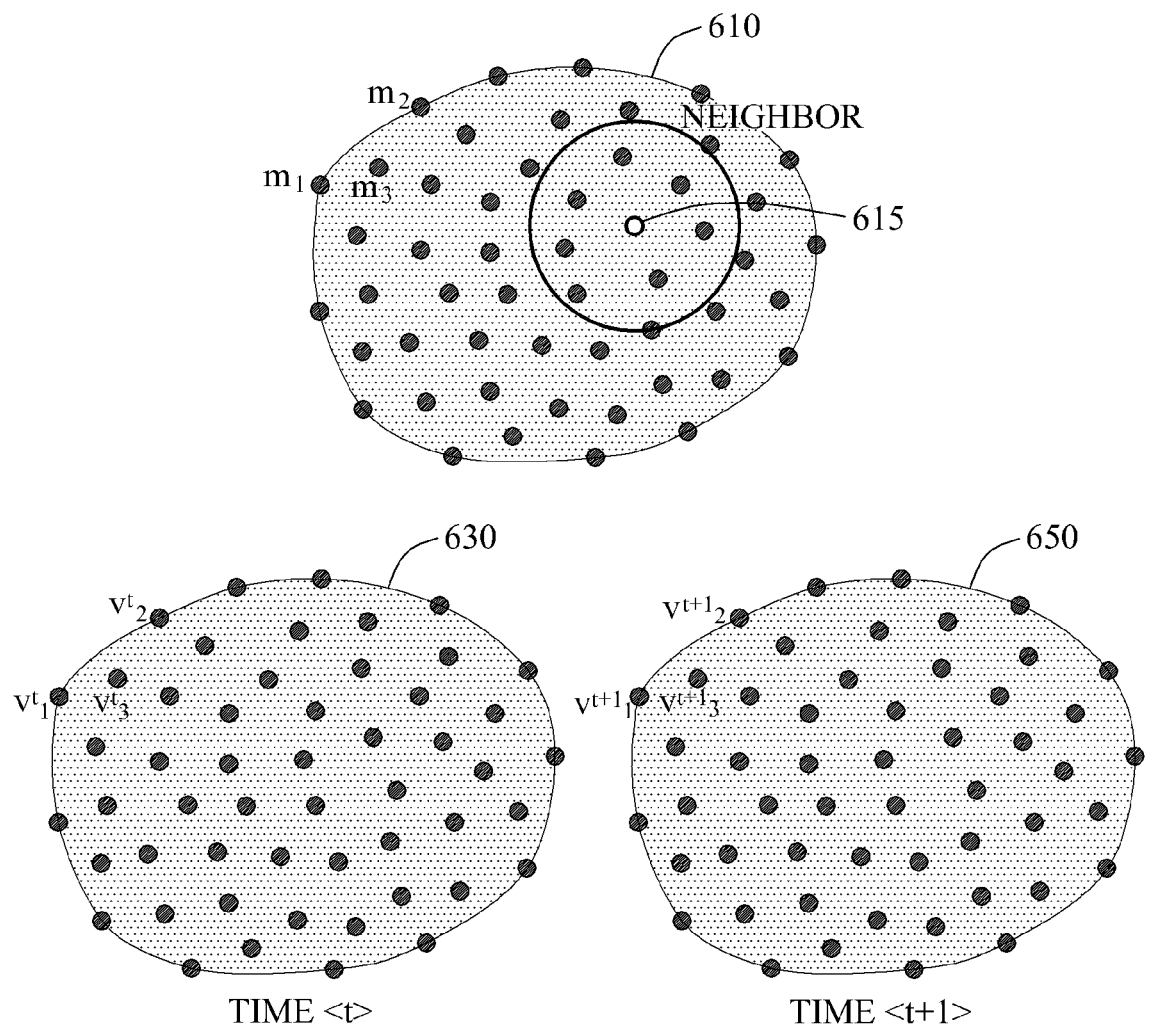
FIG. 6 illustrates an operation of calculating volumes of particles and an operation of verifying whether an overall volume of particles is preserved in a method of modeling a deformable body including particles according to an example.

FIG. 6 illustrates an operation of calculating volumes of a particles and an operation of verifying whether an overall volume of particles is preserved in a method of modeling a deformable body including particles according to an example.

In FIG. 6, an area 610 illustrates a method of calculating volumes of particles using smoothed particle hydrodynamics (SPH). Smoothed-particle hydrodynamics is a computational method used for simulating fluid flows. It is a mesh-free Lagrangian method, where the coordinates move with the fluid, and the resolution of the method can easily be adjusted with respect to variables such as the density. The smoothed-particle hydrodynamics method words by dividing the fluid into a set of discrete elements, referred to as particles. The particles have a spatial distance, referred to as the smoothing length, over which their properties are smoothed by a kernel function. Areas 630 and 650 illustrate a method of verifying whether an overall volume of particles is preserved when a time step changes.

In the area 610, each particle has a mass, and a density of each particle may be calculated based on information about neighboring particles.

In examples, a deformable body is modeled based on particles, as discussed above, using an SPH technique. Thus, a volume of a single particle 615 within the predetermined area 610 is calculated based on an average value of volumes of neighboring particles positioned within a predetermined distance from the particle 615.

In this example, the average value of the volumes of the neighboring particles is obtained by $\rho_i = \Sigma m_i W_i$ and $V_i = m_i/\rho_i$. Here, $\rho_i$ denotes a density of a particle i, $m_i$ denotes a mass of the particle i, and $W_i$ denotes a kernel function, for example, a weight function.

The area 630 indicates a volume of each particle at a time t, and the area 650 indicates a volume of each particle at a time t+1.

A modeling apparatus calculate a variation in a volume of each particle with respect to a time, for example, an appropriate time step using the following method.

In such an approach, the modeling apparatus divides an area into an expanding particle and a contracting particle and calculates the variation in the volume so that $\Sigma(\Delta V_i/\Delta t) \approx 0$ is satisfied. Here, $\Delta V_i$ denotes a variation in a volume of each particle, and $\Delta t$ denotes a variation in time. Thus, the goal of such an approach is to keep the sum of these values to be as small as possible, in order to ensure that overall volume change is kept as close as possible to 0. As discussed, this goal is implemented because the goal is to model a deformable object that is not compressible.

In such an approach, the modeling apparatus maintains a volume at a current time step to be a value of $\Delta V_i/\Delta D = (V^{t+1}_i - V^t_i)/\Delta d$.

Figure 7:
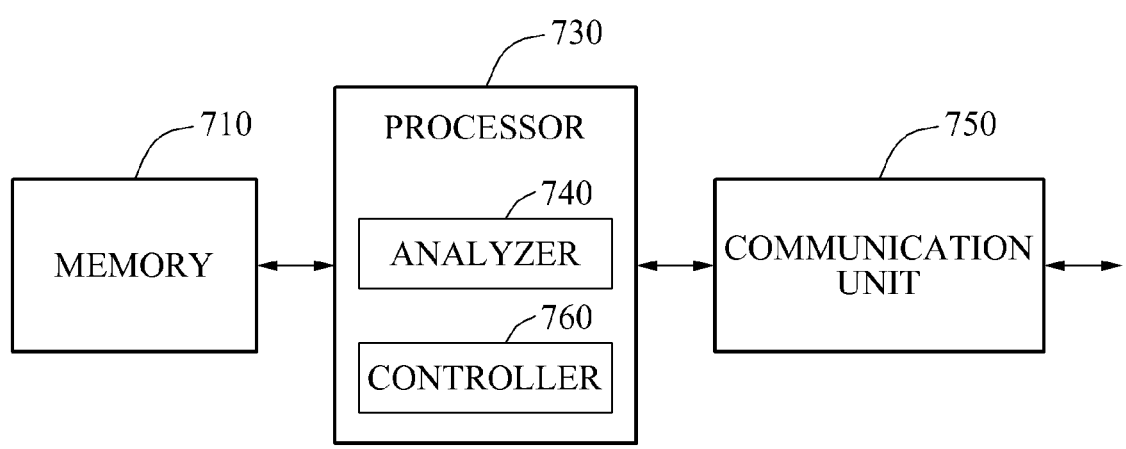
FIG. 7 illustrates an apparatus for modeling a deformable body including particles according to an example.

FIG. 7 illustrates an apparatus for modeling a deformable body including particles according to an example.

Referring to FIG. 7, the modeling apparatus includes a memory 710, and a processor 730. The modeling apparatus optionally further includes a communication unit 750. FIG. 7 is not intended to be limiting, and the modeling apparatus optionally includes additional components in addition to these components.

In the example of FIG. 7, the memory 710 stores a program to control an operation of the modeling apparatus.

Also, in the example of FIG. 7, the processor 730 executes the program recorded by the memory 710. Here, at least one processor 730 is provided.

However, the processor 730 includes specialized components that function to allow it to perform its operations. For example, the processor includes an analyzer 740 and a controller 760. In an example, the analyzer 740 includes hardware adapted to analyze aspects of strain energy acting upon a deformable body, and the controller 760 includes hardware adapted to control the displacement based upon information generated by the analyzer 740.

For example, the program defines a strain energy generated by an external force with respect to a deformable body including particles. Thus, the program controls a displacement of the deformable body based on a volume of the particles corresponding to the displacement of the deformable body determined based on the strain energy. These operations are performed by the analyzer 740 and/or the controller 760.

Here, the program defines the strain energy using a strain energy density function in which the external force and the displacement are variables. For example, such an operation is performed by the analyzer 740 and/or the controller 760.

Also, the program defines a variation in an internal force generated in an internal portion of the deformable body based on the strain energy, and determines the displacement of the deformable body based on the variation in the internal force. For example, such an operation is performed by the analyzer 740 and/or the controller 760.

Further, the program verifies whether the volume of the particles is preserved by the displacement, and controls the displacement based on a result of the verifying. For example, such an operation is performed by the analyzer 740 and/or the controller 760.

Additionally, the program verifies whether an overall volume of the particles rearranged by the displacement is preserved. For example, such an operation is performed by the analyzer 740 and/or the controller 760.

Also, the program verifies whether the overall volume of the particles is preserved, based on a variation in the overall volume of the particles before and after the particles are relocated by the displacement. For example, such an operation is performed by the analyzer 740 and/or the controller 760.

Further, the program verifies whether the overall volume of the particles relocated by the displacement is within a predetermined limited range. For example, such an operation is performed by the analyzer 740 and/or the controller 760.

Further, the program receives a modeling condition including constraints and the external force for modeling of the deformable body. As discussed, the external force potentially changes at each time step. For example, such an operation is performed by the analyzer 740 and/or the controller 760.

In examples, the program selects a time step for modeling the deformable body including the particles.

When a single period during which modeling is performed is set to 1 second, the program determines how often changes in the deformable body are to be modeled. For example, when the time step corresponds to 100 seconds, the modeling apparatus model appropriate periodic changes, for example, changes occurring every 100 seconds with respect to all particles constituting the deformable body.

In examples, the time step is selected to be an appropriate value by the program or a user of the modeling apparatus.

The examples described offer an improved technique for modelling deformable bodies in real time.

The apparatuses and units described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, a hardware component may include multiple processors or a processor and a controller. In addition, different processing configurations are possible, such as parallel processors.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The media may also include, alone or in combination with the software program instructions, data files, data structures, and the like. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

As a non-exhaustive illustration only, a terminal/device/unit described herein may refer to mobile devices such as, for example, a cellular phone, a smart phone, a wearable smart device (such as, for example, a ring, a watch, a pair of glasses, a bracelet, an ankle bracket, a belt, a necklace, an earring, a headband, a helmet, a device embedded in the cloths or the like), a personal computer (PC), a tablet personal computer (tablet), a phablet, a personal digital assistant (PDA), a digital camera, a portable game console, an MP3 player, a portable/personal multimedia player (PMP), a handheld e-book, an ultra mobile personal computer (UMPC), a portable lab-top PC, a global positioning system (GPS) navigation, and devices such as a high definition television (HDTV), an optical disc player, a DVD player, a Blu-ray player, a setup box, or any other device capable of wireless communication or network communication consistent with that disclosed herein. In a non-exhaustive example, the wearable device may be self-mountable on the body of the user, such as, for example, the glasses or the bracelet. In another non-exhaustive example, the wearable device may be mounted on the body of the user through an attaching device, such as, for example, attaching a smart phone or a tablet to the arm of a user using an armband, or hanging the wearable device around the neck of a user using a lanyard.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of modeling a deformable body comprising particles, the method comprising:
    determining, at an analyzer, a strain energy based on an external force applied to the deformable body;
    calculating, at the analyzer, a particle displacement of each particle among the particles based on the strain energy;
    calculating, at the analyzer, an internal force in an internal portion of the deformable body based on the particle displacement for the particles;
    determining, at the analyzer, an overall displacement of the deformable body based on the particle displacement for the particles and the internal force;
    adjusting, at a controller, the overall displacement of the deformable body based on a volume of the particles; and
    verifying whether the volume of the particles is preserved by the overall displacement,
    in response to the volume of the particles not being preserved, further adjusting the overall displacement by multiplying the particle displacement by a constant so that a sum of variations in volume of all the particles satisfies a threshold and a variation in a volume of each particle is a difference from a previous time step and to a current time step.

2. The method of claim 1, wherein the determining of the strain energy comprises determining the strain energy using a strain energy density function based on the external force and the particle displacement.

3. The method of claim 2, wherein the strain energy density function comprises a parameter associated with an elasticity of the deformable body.

4. The method of claim 1, wherein the determining of the overall displacement comprises:
defining a variation in the internal force; and
determining the overall displacement of the deformable body based on the variation in the internal force.

5. The method of claim 1, wherein the verifying comprises verifying whether an overall volume of the particles relocated by the overall displacement is preserved.

6. The method of claim 5, wherein the verifying of whether the overall volume of the particles is preserved comprises verifying whether the overall volume of the particles is preserved based on a comparison between the overall volume of the particles before and after the particles are relocated by the overall displacement.

7. The method of claim 5, wherein the verifying of whether the overall volume of the particles is preserved comprises verifying whether the overall volume of the particles relocated by the overall displacement is within a predetermined range.

8. The method of claim 1, further comprising:
receiving a modeling condition comprising constraints and the external force for modeling of the deformable body.

9. The method of claim 1, wherein the external force changes at each of a plurality of time steps over time.

10. A non-transitory computer-readable medium storing a program for causing a processor to perform the method of claim 1.

11. An apparatus to model a deformable body comprising particles, the apparatus comprising:
a processor configured to
determine a strain energy based on an external force applied to the deformable body;
calculate a particle displacement of each particle among the particles based on the strain energy;
calculate an internal force in an internal portion of the deformable body based on the particle displacement for the particles;
determine an overall displacement of the deformable body based on the particle displacement for the particles and the internal force;
adjust the overall displacement of the deformable body based on a volume of the particles;
verify whether the volume of the particles is preserved by the overall displacement, and
wherein the processor is further configured to adjust the overall displacement by multiplying the particle displacement by a constant so that a sum of variations in volume of all the particles satisfies a threshold and a variation in a volume of each particle is a difference from a previous time step and to a current time step, in response to the volume of the particles not being preserved.

12. The apparatus of claim 11, wherein the processor is further configured to determine the strain energy using a strain energy density function based on the external force and the particle displacement.

13. The apparatus of claim 11, wherein the processor is further configured to define a variation in the internal force, and determine the overall displacement of the deformable body based on the variation in the internal force.

14. The apparatus of claim 11, wherein the processor is further configured to verify whether an overall volume of the particles relocated by the overall displacement is preserved.

15. The apparatus of claim 14, wherein the processor is further configured to verify whether the overall volume of the particles is preserved based on a comparison between the overall volume of the particles before and after the particles are relocated by the overall displacement.

16. The apparatus of claim 14, wherein the processor is further configured to verify whether the overall volume of the particles relocated by the overall displacement is within a predetermined range.

17. The apparatus of claim 11, wherein the processor is further configured to receive a modeling condition comprising constraints and the external force for modeling of the deformable body.

18. The apparatus of claim 11, wherein the external force changes at each of a plurality of time steps over time.

* * * * *